United States Patent
Akatsu (10) Patent No.: US 7,323,398 B2
(45) Date of Patent: Jan. 29, 2008

(54) METHOD OF LAYER TRANSFER COMPRISING SEQUENTIAL IMPLANTATIONS OF ATOMIC SPECIES

(75) Inventor: Takeshi Akatsu, St. Nazaire les Eymes (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 211 days.

(21) Appl. No.: 11/229,698

(22) Filed: Sep. 20, 2005

(65) Prior Publication Data
US 2006/0063353 A1 Mar. 23, 2006

Related U.S. Application Data

(63) Continuation of application No. PCT/IB2004/03301, filed on Sep. 21, 2004.

(51) Int. Cl.
H01L 21/46 (2006.01)
H01L 21/30 (2006.01)

(52) U.S. Cl. .............................. 438/458; 257/E21.318; 257/E21.568; 438/471

(58) Field of Classification Search ................ 438/458, 438/471; 257/E21.318, E21.568
See application file for complete search history.

(56) References Cited

U.S. PATENT DOCUMENTS

| | | | |
|---|---|---|---|
| 5,374,564 A | 12/1994 | Bruel | 438/455 |
| 6,100,166 A | 8/2000 | Sakaguchi et al. | 438/455 |
| 6,150,239 A | 11/2000 | Goesele et al. | 438/458 |
| 6,720,640 B2 | 4/2004 | Kuwabara et al. | 257/618 |
| 2002/0187618 A1 | 12/2002 | Kleinhenz et al. | 438/471 |
| 2004/0097055 A1 | 5/2004 | Henley et al. | 438/471 |
| 2004/0115899 A1 | 6/2004 | Bower | 438/458 |
| 2004/0248380 A1 | 12/2004 | Aulnette et al. | 438/459 |

FOREIGN PATENT DOCUMENTS

| | | |
|---|---|---|
| FR | 2 855 908 | 6/2003 |
| FR | 2 858 462 | 7/2003 |
| WO | WO 99/39378 | 8/1999 |

(Continued)

OTHER PUBLICATIONS

Agarwal, A. et al.; *Efficient Production of Slicon-on-Insulator Films by Co-Implantation of He+ with H+*; Appl. Phys. Let.; 72; pp. 1086-1088 (1998).

(Continued)

*Primary Examiner*—Asok Kumar Sarkar
(74) *Attorney, Agent, or Firm*—Winston & Strawn LLP (57) ABSTRACT

A method of manufacturing a crystalline wafer that includes implanting first atomic species in a donor substrate to form a region of weakness at a first depth therein and configured to facilitate detachment of a first layer of the donor substrate from a remaining portion of the donor substrate. The first layer and remaining portion are disposed on opposite sides of the region of weakness. The method also includes implanting second atomic species in the donor substrate to form a gettering region at a second depth therein that is different than the first depth to reduce or minimize migration of the implanted first atomic species past the gettering region. This reduces or minimizes an increase in roughness of a surface produced on the first layer after detachment thereof from the remaining portion at the region of weakness.

16 Claims, 4 Drawing Sheets

FOREIGN PATENT DOCUMENTS

WO      WO 01/15215      3/2001
WO      WO 2004/044976      5/2004

OTHER PUBLICATIONS

Cellar, G.K. et al.; *Frontiers of Silicon-on-Insulator*; J. Appl. Phys. 93:9; pp. 4955-4978 (2003).

Tong, Q.Y. et al.; *Semiconductor Wafer Bonding: Science and Technology*, Interscience Technology, Publ: John Wiley & Sons; USA; pp. 1-99 (1999).

Colinge, Jean-Pierre, "Silicon-On-Insulator Technology: Materials to VLSI, 2$^{nd}$ Edition," Kluwer Academic Publishers, 1997, pp. 50-51.

METHOD OF LAYER TRANSFER COMPRISING SEQUENTIAL IMPLANTATIONS OF ATOMIC SPECIES

CROSS-REFERENCE TO RELATED APPLICATIONS

This application is a continuation of International Application PCT/IB2004/003301, filed on Sep. 21, 2004, the entire contents of which are expressly incorporated herein by reference thereto.

FIELD OF THE INVENTION

The present invention relates generally to a crystalline wafer and a method for manufacturing thereof. More particularly, the method includes forming regions of weakness in a crystalline wafer.

BACKGROUND OF THE INVENTION

Several processes and techniques for manufacturing a crystalline wafer by transferring layers are generally known. These include, for example, the layer transfer technique reported in *Frontiers of Silicon-on-Insulator*, J. Appl. Phys. 93, 4955 (2003) by G. K. Celler et al. and based on the "SMART-CUT®" technology of Soitec S.A., which is known to those skilled in the art and descriptions of which can be found in a number of works dealing with wafer reduction techniques, such as U.S. Pat. No. 5,374,564. In the SMART-CUT® process, atomic species, such as ions, are implanted in a donor substrate to create a region of weakness therein before bonding of a handle substrate to the donor substrate. After bonding, the donor substrate splits or is cut at the region of weakness. What is obtained therefore is, on the one hand, a donor substrate, stripped of a layer of its structure, and, on the other hand, a wafer comprising, bonded together, a removed thin layer of the donor substrate and the handle substrate.

It is also known that a region of weakness can alternatively be formed in a donor substrate by forming a porous layer therein using the method known as the ELTRAN® process by Canon, described in U.S. Pat. No. 6,100,166. Additionally, various bonding techniques are generally known and include the method described in the reference entitled "Semiconductor Wafer Bonding: Science and Technology" (Interscience Technology) by Q. Y. Tong, U. Gösele and Wiley.

Layer transfer processes, for example SMART-CUT® processes, advantageously produce crystalline wafers or other structures that preferably include a thin layer of semiconductor material, such as SeOI (Semiconductor-On-Insulator), SOI (Silicon-On-Insulator), and SGOI (Silicon-Germanium-On-Insulator) structures and the like. The resulting structures from such processes are generally used for applications in the field of microelectronics, optics and/or optronics.

The term "implanting" atoms is conventionally understood to mean any bombardment of atomic species, including molecular and ionic species, suitable for introducing the species into the material of a wafer, with the implanted species having a concentration maximum at a predetermined depth within the wafer relative to the bombarded surface, so as to define a region of weakness. The region of weakness is a function of the nature of the implanted species and the implantation energy associated therewith. As will be stated hereafter, however, and within the context of the invention, implantation of atomic species is not limited to conventional bombardment implantation methods, but also extends to any method suitable for introducing atomic species into the donor substrate. In particular, implanting atomic species also includes exposing the wafer to a plasma containing the implantation species to form the region of weakness.

When implanting atomic species in a wafer by bombardment, co-implanting two different atomic species therein advantageously reduces the necessary dose of implantation by a factor of approximately 2 to 3 relative to the implantation of a single type of atomic species. For example, it is established in the article by Aditya Agarwal et al., "Efficient Production of Silicon-On-Insulator Films by Co-Implantation of He+with H+", Applied Physics Letters, vol. 72 (1998), pp. 1086-1088, that the co-implantation of hydrogen and helium enables thin layer detachment at a much lower total implantation dose than that required when either hydrogen or helium alone is implanted. This reduction of required dose translates to a reduction in the required implantation time, and also to costs associated with production of wafer structures comprising a thin layer on a handle substrate, in particular by means of a transfer process, such as Soitec's SMART-CUT® process.

Co-implantation of atomic species, however, also presents a disadvantage that blisters tend to form at the bonded interface between the free surface of the implanted donor substrate under which implantation has been carried out and the surface of the handle substrate. Formation of blisters are especially prevalent during certain additional operations, such as thermal treatments, that are commonly performed during a SMART-CUT® layer transfer process. It is known that blisters tend to form after a co-implantation of atomic species, for example helium and hydrogen species, because helium species may diffuse in the matrix of the donor substrate more easily than hydrogen species, and the risk of blister formation increases if helium is implanted close to the bonded interface.

The appearance of blisters at the bonded interface may effectively lead to the degradation of the bonded interface. Hence, when a SMART-CUT® process is carried out, blisters that form at the bonded interface may disturb the structural properties of the thin layer which has been detached. Blisters may even cause a detachment at the level of the blister sites, that is at the level of the bonded interface and not at the level of the region of weakness, thus creating "non-transferred" zones and introducing roughness and structural defects to the transferred thin layer. Structures presenting non-transferred zones are usually rejected from the production line, and hence decrease the production yield.

Additionally, blisters and voids have also been observed to some extent when an implantation is carried out by implanting a single atomic species within a donor substrate. This problem, for example, is usually encountered when producing an SOI structure that includes a thin layer of buried oxide having a thickness below about 500 angstroms, as described in U.S. Patent Application Publication No. 2004/0248380. A similar problem is also observed when direct silicon-silicon bonding occurs during the SMART-CUT® process.

Previous methods have been used to avoid blister formation. A first method includes implanting helium species deeper within the donor substrate than hydrogen species, with respect to the free surface of the donor substrate under which implantation is performed. Generally, it has been found that the deeper the helium species are implanted with respect to the hydrogen species, the less blister formation is observed at the bonded interface.

A second method of reducing blister formation includes increasing the dose of hydrogen species that are implanted, typically by a dose from about 2 to $5\times10^{15}/cm^2$. Generally, it has been found that the higher the hydrogen dose that is implanted, the less blister formation is observed at the bonded interface. In both methods, the region where hydrogen species are implanted is regarded as acting as a gettering region or barrier making it possible to block the diffusion of helium species towards the bonded interface.

In addition to concerns regarding the formation of blisters at the bonded interface, the resulting surface roughness of the thin layer of the wafer that is newly formed after SMART-CUT® processing is also a consideration. As mentioned above, the donor substrate is typically detached at the region of weakness created by the implantation step so as to transfer a part of the donor substrate onto the handle substrate, and to form the thin layer on the handle substrate. The specifications of the surface state of structures obtained by a layer transfer process such as SMART-CUT® are generally very strict. The surface roughness and the thickness uniformity of the thin layer are parameters which condition the quality of the components that are created on the structure.

In general, it has been found that after co-implantation of helium and hydrogen species in a donor substrate to create a region of weakness, the resulting surface roughness and thickness uniformity of the thin layer are most favorable (i.e. exhibit a low surface roughness and uniform thickness) when the distance between the implanted helium and hydrogen species is minimized, and when the dose at which hydrogen species are implanted is minimized. Hence, certain implantation conditions that result in the exhibition of more favorable surface roughness and uniform thickness may lead to the undesired formation of blisters, and reciprocally, conditions that avoid blister formation may result in poor surface roughness and thickness.

Due to the fact that surface roughness, thickness uniformity, and blister formation cannot be controlled separately, a compromise is typically made between employing the most favorable conditions (i.e. implantation energy for controlling implantation depth, and dose of implanted species) for avoiding blister formation and the most favorable conditions for both limiting the resulting surface roughness and obtaining a suitable thickness uniformity. By carrying out such a compromise, however, it is extremely difficult to produce a structure having an optimal surface roughness and uniformity on the one hand, and at the same time optimally avoiding the formation of blisters at the bonded interface.

Thus, there is a need for a method for producing a high quality crystalline wafer or structure that includes a thin layer of material on a substrate without compromising implantation conditions for avoiding blister formation and implantation conditions for both limiting the resulting surface roughness and obtaining a suitable thickness uniformity.

SUMMARY OF THE INVENTION

A preferred embodiment of the present invention relates to a method of manufacturing a crystalline wafer that includes implanting first atomic species in a donor substrate to form a region of weakness at a first depth therein and configured to facilitate detachment of a first layer of the donor substrate from a remaining portion of the donor substrate. The first layer and remaining portion are disposed on opposite sides of the region of weakness. The preferred embodiment also includes implanting second atomic species in the donor substrate to form a gettering region at a second depth therein that is different than the first depth, and bonding a handle substrate to the donor substrate to provide a bonded structure having a bonded interface. The gettering region is configured to reduce or minimize migration of the implanted first atomic species past the gettering region to reduce or minimize the formation of blisters at the bonded interface. Preferably, the method further includes applying energy at the region of weakness to detach the first layer from the remaining portion, and to transfer the first layer to the handle substrate.

The region of weakness is preferably formed by implanting the first atomic species at a first dose selected to reduce or minimize detachment-induced roughness produced on the surface of the first layer that is exposed by the detachment of the first layer. The first layer preferably has a surface roughness after detachment that is between about 35 and 60 Å RMS. The gettering region is preferably formed by implanting the second atomic species at a second dose and depth, which are preferably selected to reduce or minimize the detachment-induced surface roughness of the first layer. The first dose of the first atomic species and the second dose and depth of the second atomic species are also preferably selected to obtain a uniform thickness of the detached first layer.

Preferably, the gettering region is configured to reduce or minimize the formation of blisters at the bonded interface by capturing implanted first atomic species that migrate from the region of weakness. The gettering region is preferably insufficiently weak to cause detachment of the donor substrate at the gettering region upon application of energy at the region of weakness. Additionally, the second depth is selected such that the gettering region is positioned in the donor substrate between the region of weakness and the bonded interface.

The preferred embodiment further includes treating the first layer after detachment to remove material from the first layer. The material that is removed preferably includes the gettering region. The method also preferably includes annealing the first layer after detachment to cure the gettering region to reduce crystalline defects.

Preferably, the crystalline wafer includes a semiconductor. In one embodiment, the region of weakness is preferably formed before the gettering region is formed. Alternatively, another embodiment preferably includes forming the region of weakness after forming the gettering region.

Implantation of the second atomic species preferably includes atomic bombardment of the donor substrate. The implantation of the second atomic species can also include exposing the donor substrate to plasma containing the atomic species to be implanted. Preferably, the first depth at which the first atomic species are implanted is between about 50 nm and about 150 nm greater than the second depth at which the second atomic species are implanted.

With respect to the implantation of the first atomic species, the implantation preferably includes a co-implantation of at least two different atomic species. More preferably, the at least two different atomic species include hydrogen and helium species. Even more preferably, the helium species is implanted in the donor substrate before the hydrogen species. Alternatively, implantation of the first atomic species to form the region of weakness can include implantation of a single atomic species, preferably hydrogen.

With respect to the implantation of the second atomic species, the implantation preferably includes implanting a single atomic species, preferably either hydrogen species or argon species. Preferably, the single atomic species includes hydrogen implanted at a dose that is less than about $5\times10^{16}/cm^2$. The single atomic species may alternatively include argon preferably implanted at a dose that is between about $1\times10^{14}/cm^2$ and about $1\times10^{16}/cm^2$.

The present invention also relates to a crystalline wafer that includes a donor substrate comprising a region of weakness formed at a first depth and a gettering region formed at a second depth that is different from the first depth. The wafer also preferably includes a handle substrate associated with the donor substrate at a surface thereof. Preferably, the gettering region is formed in the donor substrate between the region of weakness and the surface. The region of weakness preferably includes a co-implantation of hydrogen and helium species. The gettering region preferably includes an implantation of either hydrogen or argon species.

The invention thus provides a method for producing a structure that includes a thin layer of semiconductor material on a substrate which exhibits at the same time limited blister formation, low surface roughness, and an optimal thickness uniformity.

DETAILED DESCRIPTION OF THE PREFERRED EMBODIMENTS

Referring generally to FIGS. 1-4, the preferred embodiment of present invention relates to method of manufacturing a crystalline wafer that preferably includes steps of implanting atomic species in a donor substrate 30 to create a region of weakness 32 and a gettering region 34. The region of weakness 32 preferably defines a thin layer 37 and a remaining portion 38 of the donor substrate 30. The thin layer 37 is preferably transferred from the donor substrate 30 to a handle substrate 40 according a SMART-CUT® process by bonding the handle substrate 40 to the donor substrate 30 at the surface 36 thereof to form a bonded structure 50, and applying energy to the bonded structure 50 at the region of weakness 32 to detach a detached portion 42, including the handle substrate 40 and the thin layer 37, from the remaining portion 38 of the donor substrate 30.

Figure 1:
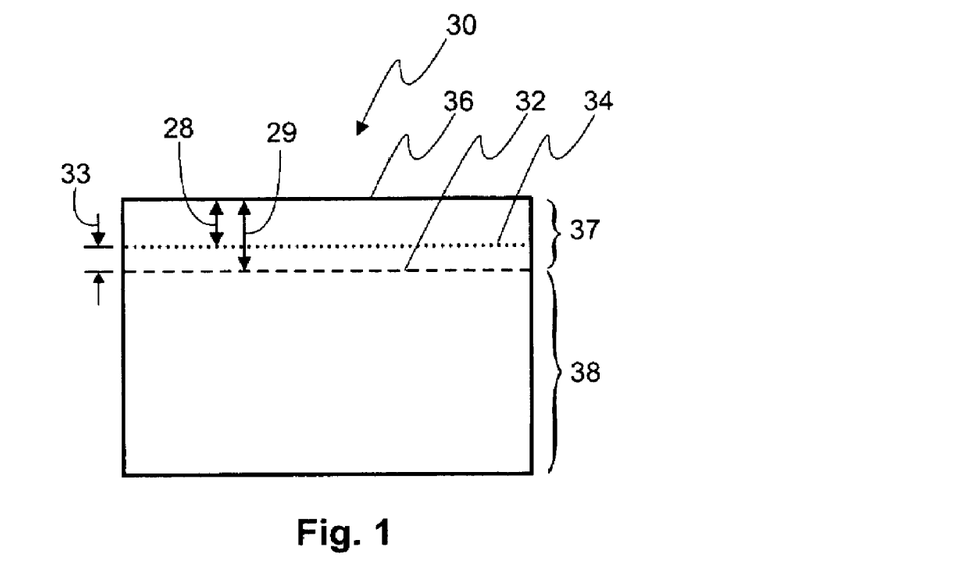
FIG. 1 shows a structure manufactured according to the present invention after implantation of first and second atomic species within a donor substrate.

The crystalline wafer can be any type of structure that includes a thin layer 37 of material having a free surface 41, i.e., a surface exposed to the external environment. Preferably, the thin layer 37 is made of a semiconductor material, and the structure is preferably a semiconductor wafer. The donor substrate 30 preferably includes silicon and the thin layer 37 of semiconductor material preferably includes, for example, silicon, silicon carbide, germanium, silicon germanium, gallium arsenide, or gallium nitride.

The handle substrate 40 preferably includes, for example, silicon, quartz, or any other suitable material that constitutes a mechanical support sufficiently strong to support the thin layer 37 and protect it from possible external mechanical stresses. Preferably, the handle substrate 40 is made of a single material, but it can also include multiple layers of different materials.

Referring to FIG. 1, the preferred embodiment of the invention preferably includes two implantation operations: one operation preferably includes implanting atomic species to create a region of weakness 32 at a depth in the donor substrate 30, and another operation preferably includes implanting atomic species to create a gettering region 34 at a depth in the donor substrate 30.

Preferably, the region of weakness 32 is formed at a first predetermined depth 29. The region of weakness 32 preferably extends generally planarly and in parallel with respect to the surface 36 of the donor substrate 30. The region of weakness 32 preferably defines the thin layer 37 of the donor substrate 30 between the surface 36 and the region of weakness 32, and separates the thin layer 37 from the remaining portion 38.

Preferably, the region of weakness 32 is formed by implanting a sufficient dose of atomic species through, for example, the surface 36 of the donor substrate 30 to the first predetermined depth 29. The implantation of atomic species can include any suitable bombardment of atomic species, including molecular or ionic species, which can introduce the species through a surface with a maximum concentration of the species located at the first predetermined depth 29 from the surface 36. Suitable methods of atomic species implantation include the use of an ion beam implanter or a plasma immersion implanter as known in the art. Preferably, the atomic species include ions hydrogen, helium, or a co-implantation of both, however, ions of other noble gases can alternatively be used. Implantation of ions is advantageously a very accurate and efficient method for forming of the region of weakness 32.

The formation of the region of weakness 32 by implantation is preferably performed by implanting a single species or by co-implanting at least two different species at the first predetermined depth 29 within the donor substrate 30. In one preferred embodiment, two different atomic species are co-implanted at the same first predetermined depth 29 by conventionally submitting the surface 36 of the donor substrate 30 to atomic bombardment. Preferably, the atomic species that are co-implanted to form the region of weakness are hydrogen and helium species. More preferably, the co-implantation is carried out by sequentially implanting helium species and then implanting hydrogen species. Alternatively, another preferred embodiment includes only implanting a single species, preferably hydrogen species, at the first predetermined depth 29 to form the region of weakness 32.

During formation of the region of weakness 32, the dose of the implanted species and the depth at which the species are implanted (collectively referred to as "first implantation conditions") are preferably adapted for optimally obtaining and preserving desirable characteristics of the thin layer 37 that result after detachment, which include reduced surface roughness and uniform thickness thereof. More preferably, the first implantation conditions are selected independent of considerations relating to preventing or substantially reducing the occurrence of blister formation at the surface 36 of the thin layer 37 after bonding (the "bonded interface"). In the preferred embodiment, the helium and hydrogen species are both implanted at the same first predetermined depth 29 and at a reduced dose, preferably between about $0.5 \times 10^{16}/cm^2$ and about $2 \times 10^{16}/cm^2$, such that when a finishing treatment is performed after detachment, for example a rapid thermal annealing ("RTA"), the thin layer 37 exhibits a reduced level of surface roughness and a desirable uniform thickness compared to characteristics that typically result following implantation of a higher dose of hydrogen alone to form the region of weakness 32.

Figure 2:
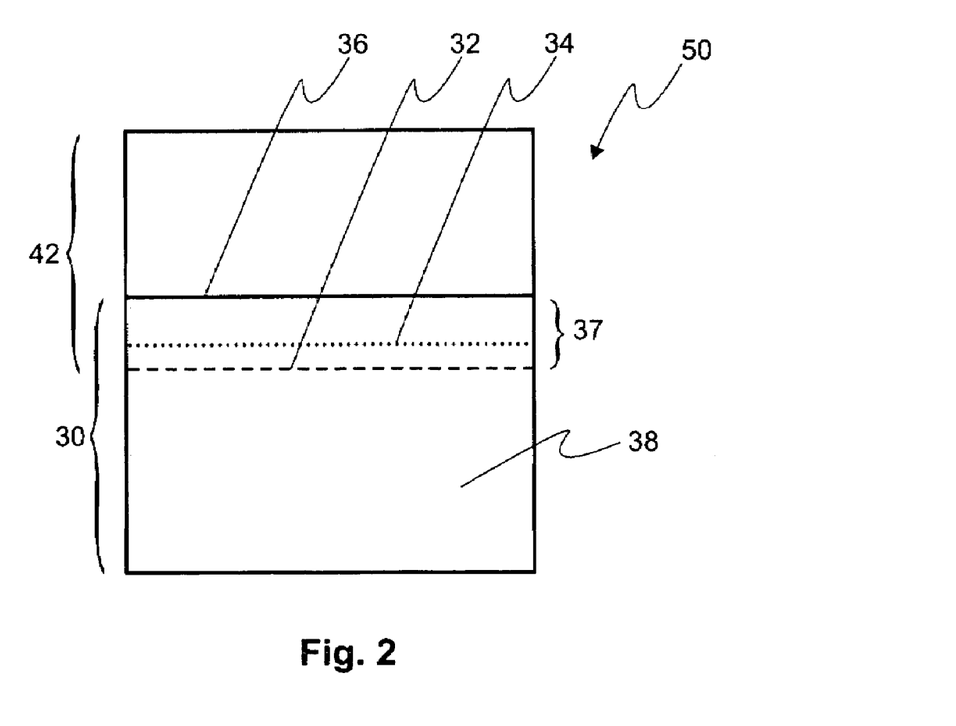
FIG. 2 shows the donor substrate of FIG. 1 after bonding to a handle substrate to provide a bonded structure.

Since selection of the first co-implantation conditions are preferably not compromised by considerations of blister formation, there remains a risk, as previously described, that blisters may form due to the action of atomic species, for example helium, diffusing under thermal activation towards the bonded interface 36 after formation of the bonded structure shown in FIG. 2. Thus, to prevent or substantially reduce blister formation at the bonded interface 36, the preferred embodiment includes a second implantation operation. Preferably, the second implantation operation may be performed by either conventional bombardment or plasma implantation of atomic species. Preferably, the first implantation operation to form the region of weakness 32 is performed before the second implantation operation to form the gettering region 34, however, in one embodiment, the gettering region 34 is formed prior to formation of the region of weakness 32.

During the second implantation operation, the dose of the implanted species and the depth at which the species are implanted (collectively referred to as "second implantation conditions") are preferably adapted to create a gettering region 34 at a second predetermined depth 28 that is different from the first predetermined depth 29 of the region of weakness 32. The implantation energy of the second implantation conditions is advantageously adapted for forming the gettering region 34 at the second predetermined depth 28 relatively close to the region of weakness 32 at the first predetermined depth 29. The distance between the first predetermined depth 29 and the second predetermined depth 28 is preferably at least about 30 nm and more preferably at least about 50 nm, and preferably at most about 170 nm and more preferably at most about 150 nm. Preferably, the first predetermined depth 29 is greater than the second predetermined depth 28 such that the gettering region 34 is formed within the thin layer 37 between the region of weakness 32 and the surface 36 of the thin layer 37, as shown in FIG. 2.

The implantation dose of atomic species of the second implantation operation is advantageously a relatively low dose, but preferably large enough for generating defects within the donor substrate 30 in a sufficient density such that the gettering region 34 acts as a gettering site for the diffusing atomic species of the first implantation operation during migration thereof. In one embodiment, only hydrogen species are implanted to form the gettering region 34, preferably at a dose less than about $5 \times 10^{16}/cm^2$ and more preferably at a dose less than about $1 \times 10^{16}/cm^2$. In another embodiment, other single atomic species, for example argon species, are preferably implanted to form the gettering region 34. Preferably, argon species are implanted at a dose of between about $1 \times 10^{14}/cm^2$ and $1 \times 10^{16}/cm^2$, and more preferably at a dose of about $1 \times 10^{15}/cm^2$.

Because the second predetermined depth 28 is different from the first predetermined depth 29, the second implantation to form the gettering region 34 advantageously does not interfere with or detrimentally effect detachment of the bonded structure 50 at the region of weakness 32. The expected surface roughness and thickness uniformity of the thin layer 37 are also not affected by the second implantation operation to form the gettering region 34. In other words, the second implantation conditions advantageously do not affect the desired surface roughness and thickness uniformity characteristics that are achieved by the first implantation conditions of the first implantation operation.

Preferably, the gettering region 34 is configured for preventing the atomic species implanted at the region of weakness 32 during the first implantation operation from diffusing past the gettering region 34 towards the bonded interface 36, thus preventing or substantially reducing blister formation. Under thermal activation, helium species that are implanted to form the region of weakness 32 tend to diffuse away from the region of weakness 32 and towards the bonded interface 36 to promote the formation of blisters thereat. The gettering region 34, which is preferably formed between the region of weakness 32 and the bonded interface 36, advantageously getters or otherwise captures helium species during their migration from the region of weakness 32 to prevent the species from reaching the bonded interface 36.

Figure 5:
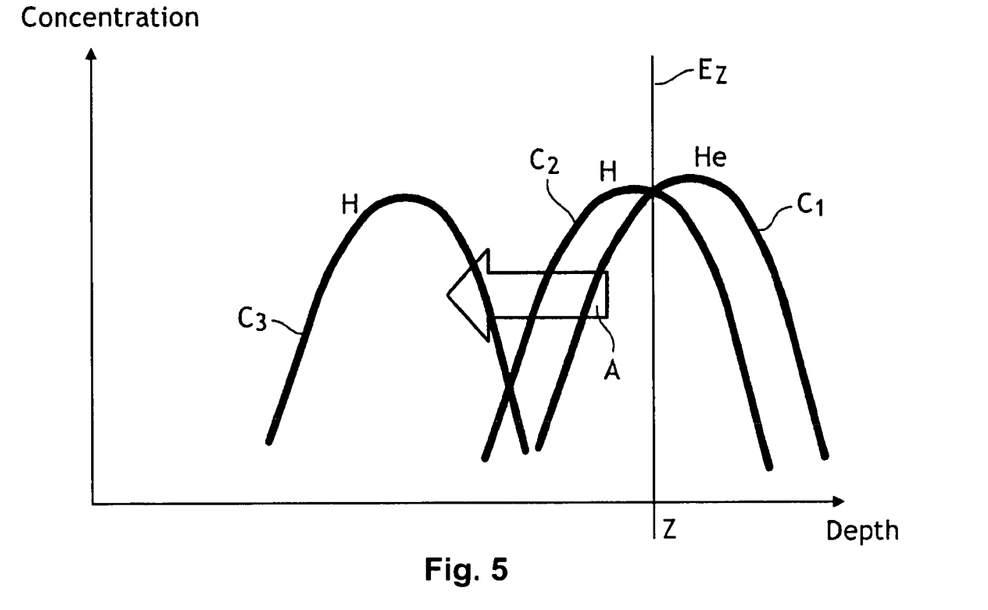
FIG. 5 is a graph that depicts a concentration distribution of implanted species within a donor substrate according to an embodiment of the present invention.

FIG. 5 depicts a concentration repartition within the thickness of a donor substrate for the different implanted atomic species. Helium He and hydrogen H species are preferably co-implanted during the first implantation operation and their respective distributions in the thickness of the donor substrate are illustrated by curves $C_1$ and $C_2$, so as to create a region of weakness represented by reference $E_Z$ at depth Z. Hydrogen H species are also preferably implanted during the second implantation operation to form a gettering region at a depth less than the depth Z of the region of weakness, and their distribution in the thickness of the donor substrate is illustrated by curve $C_3$. During a thermal treatment, arrow A represents the diffusion of helium species towards the gettering region created by the hydrogen species of curve $C_3$. Advantageously, the diffusion of helium species towards the zero depth region donor substrate is avoided, and blister formation is prevented or substantially reduced, due to the gettering of the helium species at the gettering region.

Figure 3:
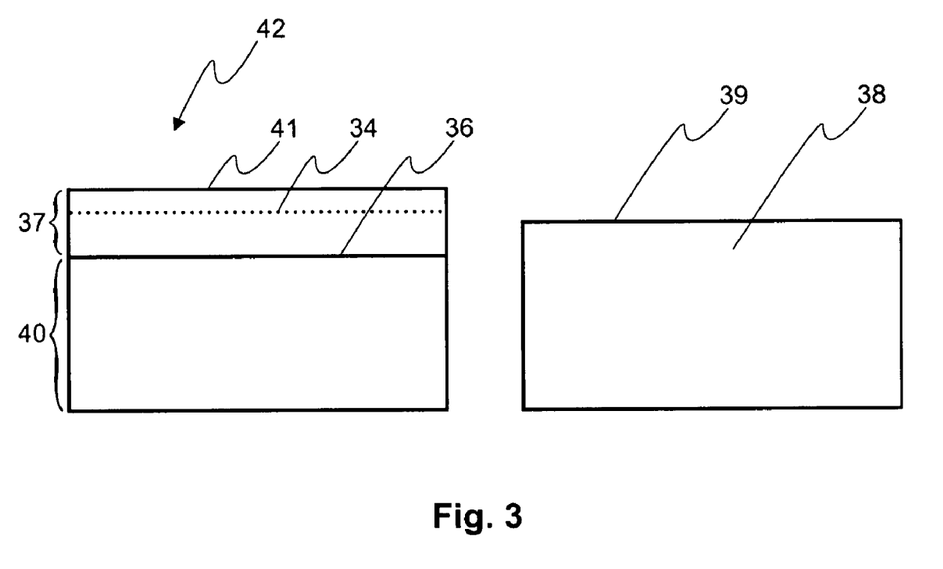
FIG. 3 shows the bonded structure of FIG. 2 after detachment of a detached portion from a remaining portion.

After formation of the region of weakness 32 and the gettering region 34, the thin layer 37 is transferred to the handle substrate 40, preferably according to SMART-CUT® techniques. The handle substrate 40 is preferably bonded to the thin layer 37 at the bonded interface 36 to form the bonded structure 50, as shown in FIG. 2. Energy is then preferably applied to the bonded structure 50 at the region of weakness 32 to facilitate detachment of a detached portion 42 from the remaining portion 38, as shown in FIG. 3. Preferably, the detached portion 42 includes the handle substrate 40 and the thin layer 37, with the gettering region 34 formed therein and having a free surface 41. The remaining portion 38 preferably includes the free surface 39.

In one embodiment, a layer of oxide is preferably formed on the surface 36 of the thin layer 37 prior to bonding to the handle substrate 40. As a result, when the thin layer 37 is transferred to the handle substrate 40 after bonding and detachment, the layer of oxide is buried therebetween. The resulting detached portion is therefore preferably formed as a SeOI (Semiconductor-On-Insulator) wafer and more preferably as a SOI (Silicon-On-Insulator) wafer.

Figure 4:
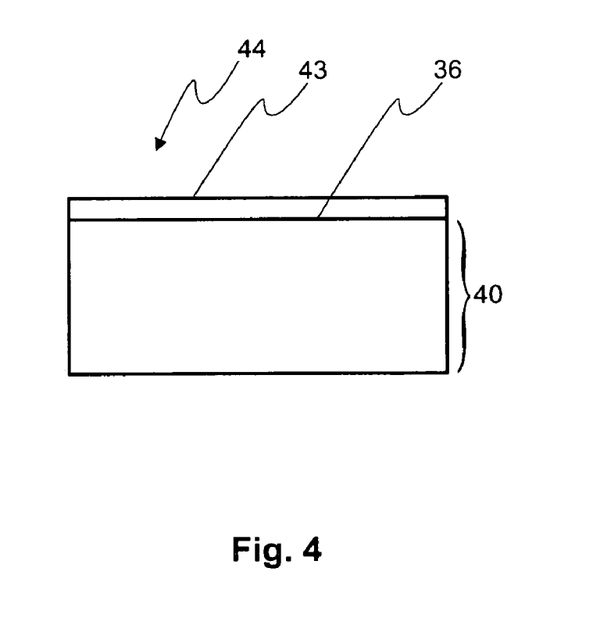
FIG. 4 shows the detached portion of FIG. 3 after performing surface treatment on the free surface thereof.

After detachment, the detached portion 42 is preferably subjected to a material removal treatment for removing a portion of the thin layer 37, as shown in FIG. 4. More preferably, the material removal treatment facilitates removal of substantially the entire gettering region 34 such that the gettering region 34 does not influence the quality of the final structure. The material removal treatment is preferably carried out according to surface treatment techniques generally known in the art such as a chemical-mechanical polishing ("CMP"), a sacrificial oxidation, dry or wet chemical etching, or other similar procedures. The resulting roughness of the surface 41 of the thin layer 37 is preferably at least about 20 angstroms RMS and at most about 70 angstroms RMS, and more preferably between about 35 and about 60 angstroms RMS.

The preferred embodiment also includes subjecting the detached portion 42 to a thermal or annealing treatment, for example simple annealing in a furnace or an RTA at a temperature of about 1,000° C. Advantageously, the thermal treatment acts to anneal out the slight crystalline defects induced during formation of the gettering region 34, thus effectively curing the gettering region 34.

EXAMPLES

The present invention is illustrated by the following Examples that are merely for the purpose of illustration and are not to be regarded as limiting the scope of the invention or the manner in which it can be practiced.

Example 1

A first structure $S_1$ and a second structure $S_2$ were produced and compared with respect to the amount of blister formation observed at each respective bonded interface and the resulting surface roughnesses. A region of weakness was formed in the first structure $S_1$ by implanting only a co-implantation of helium and hydrogen species at implantation conditions that typically result in the formation of blisters, i.e., implanting both species at substantially the same depth within the donor substrate and implanting hydrogen species at a relatively low dose. Helium species were implanted with an implantation energy of 49 keV and a dose of $1.5 \times 10^{16}/cm^2$, and hydrogen species were implanted with an implantation energy of 32 keV and a dose of $1 \times 10^{16}/cm^2$.

The second structure $S_2$ was produced according to a preferred embodiment of the present invention. The implantation of atomic species preferably included an initial co-implantation operation to form a region of weakness in the second structure $S_2$ under similar conditions as the co-implantation operation used to produce the region of weakness in the first structure $S_1$. A subsequent implantation operation was performed to implant only hydrogen species within the donor substrate to form a gettering region therein. Hydrogen species were implanted with an implantation energy of 20 keV and at a dose of $0.5 \times 10^{16}/cm^2$.

Table 1 details the implantation conditions for producing structures $S_1$ and $S_2$.

TABLE 1

|  |  | $S_1$ | $S_2$ |
|---|---|---|---|
| First implantation operation (He/H co-implantation) | He implantation | 49 keV $1.5 \times 10^{16}/cm^2$ | 49 keV $1.5 \times 10^{16}/cm^2$ |
|  | H implantation | 32 keV $1 \times 10^{16}/cm^2$ | 32 keV $1 \times 10^{16}/cm^2$ |
| Second implantation operation (H only implantation) | H implantation | None | 20 keV $0.5 \times 10^{16}/cm^2$ |

Structures $S_1$ and $S_2$ were then subjected to classical surface treatments that included an annealing treatment.

Figure 6:
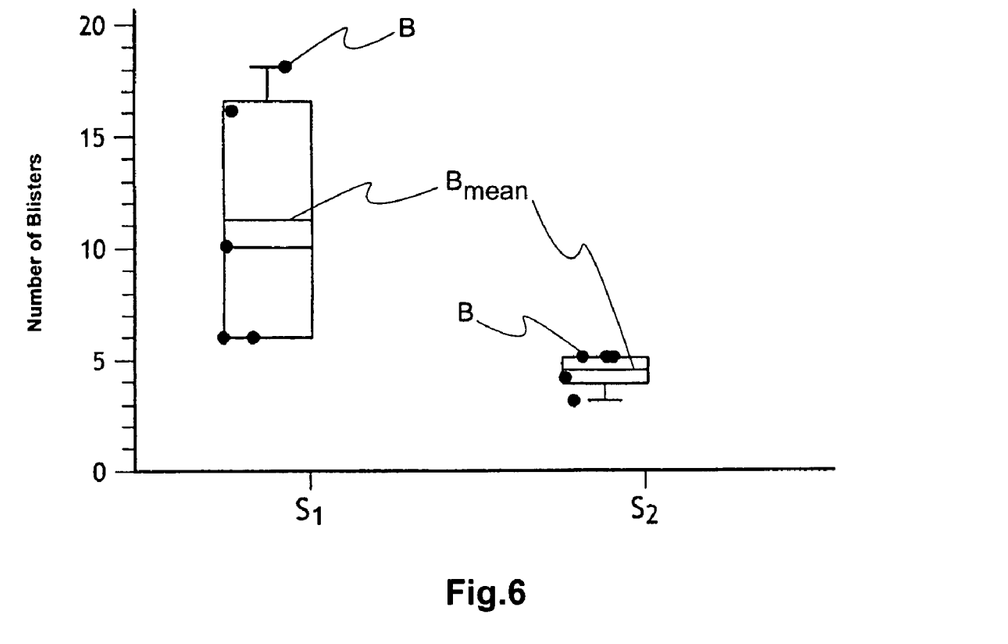
FIG. 6 is a graph that depicts the number of blisters observed at the bonded interfaces of structures in empirical trials.

FIG. 6 illustrates the number of blisters (scaled along the vertical axis and represented as circles B) observed at the bonded interface of each of the structures $S_1$ and $S_2$ after five separate trials were conducted where five separate structures of $S_1$ and $S_2$ were subjected to the annealing treatment. The number of blisters observed on the second structure $S_2$ is significantly lower compared to those observed on the first structure $S_1$. Whereas the mean number of observed blisters $B_{mean}$ for the first structure $S_1$ is 11.2, the mean number of observed blisters $B_{mean}$ is only 4.4 for the second structure $S_2$.

Figure 7:
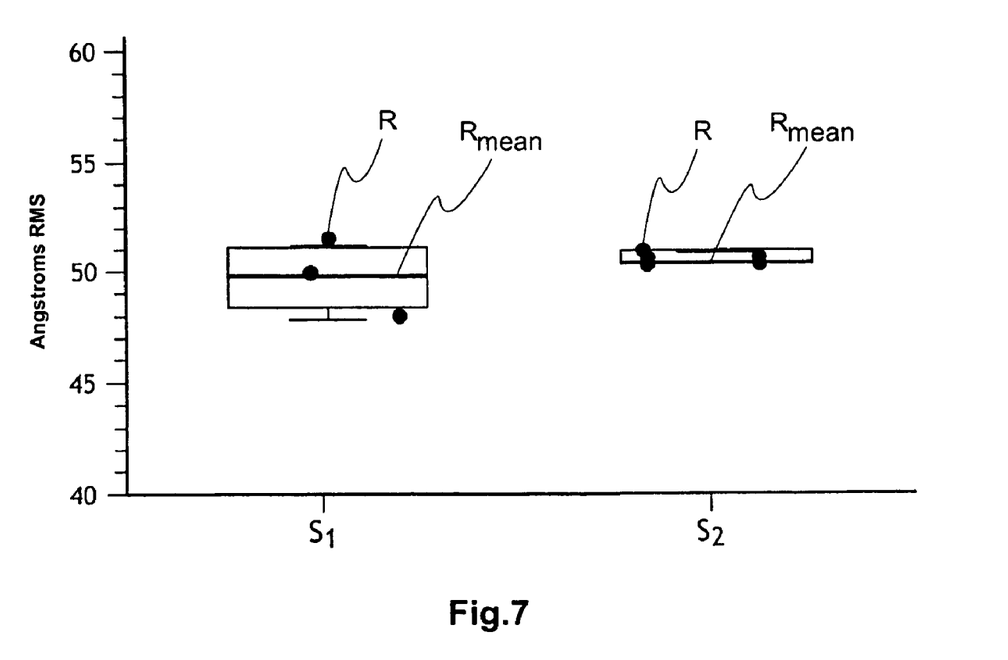
FIG. 7 is a graph that depicts the roughness RMS values of the free surfaces of structures in empirical trials.

FIG. 7 illustrates the roughness RMS values of the free surfaces (scaled along the vertical axis and represented as circles R) measured for structures $S_1$ and $S_2$ by a $10 \times 10$ µm$^2$ AFM scan after the five separate trials using the annealing treatment. The surface roughness displayed by structure $S_2$ is almost identical to that of structure $S_1$. The mean roughness $R_{mean}$ of structure $S_2$ is 50.7 angstroms RMS while the $R_{mean}$ of structure $S_1$ is 49.8 angstroms RMS.

It is apparent that implantation conditions can be optimized to achieve desirable surface roughness characteristics by employing conditions of a first implantation operation, for example a helium/hydrogen co-implantation to form a region of weakness, while at the same time substantially reducing the formation of blisters by employing conditions of a second implantation operation, for example a hydrogen implantation to form a gettering region for blocking the diffusion of helium to the bonded interface. The method according to the present invention thus preferably avoids having to make the classic compromise between implantation conditions for avoiding blisters and implantation conditions for limiting the resulting surface roughness and obtaining a suitable thickness uniformity.

Example 2

An SOI structure $S_3$ having a thin layer of buried oxide was produced by oxidizing a silicon substrate to form a superficial oxide layer thereon having a thickness of 200 angstroms. The SOI structure $S_3$ was then subjected to an initial implantation operation of hydrogen species only with an implantation energy of 37 keV and at a dose of $5 \times 10^{16}/cm^2$. A subsequent implantation operation of argon species only was performed with an implantation energy of 200 keV and at a dose of $5 \times 10^{14}/cm^2$.

Table 2 details the implantation conditions for producing SOI structure $S_3$.

TABLE 2

|  | $S_3$ |
|---|---|
| First implantation operation (H implantation) | 37 keV $5.10^{16}/cm^2$ |
| Second implantation operation (Ar implantation) | 200 keV $5.10^{14}/cm^2$ |

After detachment, very few blisters were observed at the bonded interface of the SOI structure $S_3$, and a $10 \times 10$ µm$^2$ AFM scan revealed a surface roughness of about 60 angstroms RMS. The SOI structure $S_3$ was then subjected to an annealing treatment, and a subsequent $10 \times 10$ µm$^2$ AFM scan revealed a surface roughness as low as a few angstroms RMS.

The term "about," as used herein, should generally be understood to refer to both the corresponding number and a range of numbers. Moreover, all numerical ranges herein should be understood to include each whole integer within the range.

While illustrative embodiments of the invention are disclosed herein, it will be appreciated that numerous modifications and other embodiments can be devised by those of ordinary skill in the art. Features of the embodiments described herein can be combined, separated, interchanged, and/or rearranged to generate other embodiments. Therefore, it will be understood that the appended claims are intended to cover all such modifications and embodiments that come within the spirit and scope of the present invention.

What is claimed is:

1. A method of manufacturing a crystalline wafer, comprising:
    implanting first atomic species in a donor substrate to form a region of weakness at a first depth therein and configured to facilitate detachment of a first layer of the donor substrate from a remaining portion of the donor substrate, which first layer and remaining portion are disposed on opposite sides of the region of weakness;
    implanting second atomic species in the donor substrate to form a gettering region at a second depth therein that is different than the first depth;
    bonding a handle substrate to the donor substrate to provide a bonded structure having a bonded interface;
    wherein the gettering region is configured to reduce or minimize migration of the implanted first atomic species past the gettering region to reduce or minimize the formation of blisters at the bonded interface;
    detaching the first layer from the donor substrate to transfer it to the handle substrate; and
    treating the first layer after detachment to remove material from the first layer including the entire gettering region.

2. The method of claim 1, wherein the detaching comprises applying energy at the region of weakness to detach the first layer from the remaining portion, and to transfer the first layer to the handle substrate.

3. The method of claim 2, wherein the first atomic species is implanted at a first dose selected to reduce or minimize detachment-induced roughness produced on the surface of the first layer that is exposed by the detachment of the first layer.

4. The method of claim 3, wherein the second atomic species is implanted at a second dose and at a depth selected to reduce or minimize detachment-induced surface roughness of the first layer.

5. The method of claim 4, wherein the first dose of the first atomic species and the second dose and depth of the second atomic species are selected to obtain a uniform thickness of the detached first layer.

6. The method of claim 2, wherein the gettering region is insufficiently weak to cause detachment of the donor substrate at the gettering region upon application of energy at the region of weakness.

7. The method of claim 2, further comprising annealing the first layer after detachment to cure the gettering region to reduce crystalline defects.

8. The method of claim 1, wherein the gettering region is configured to reduce or minimize the formation of blisters at the bonded interface by capturing implanted first atomic species that migrate from the region of weakness.

9. The method of claim 1, wherein the second depth is selected such that the gettering region is positioned in the donor substrate between the region of weakness and the bonded interface.

10. The method of claim 1, wherein the crystalline wafer comprises a semiconductor and the first depth is between about 50 nm and about 150 nm greater than the second depth.

11. The method of claim 1, wherein the region of weakness is formed before the gettering region is formed.

12. The method of claim 1, wherein implanting the first atomic species to form the region of weakness comprises co-implantation of at least two different atomic species.

13. The method of claim 12, wherein the at least two different atomic species comprise hydrogen and helium species, and the helium species is implanted in the donor substrate before the hydrogen species.

14. The method of claim 1, wherein the first and second atomic species each comprise a single atomic species.

15. The method of claim 14, wherein the second atomic species comprises either hydrogen species implanted at a dose that is less than about $5\times10^{16}/cm^2$ or argon species implanted at a dose that is between about $1\times10^{14}/cm^2$ and about $1\times10^{16}/cm^2$.

16. The method of claim 1, wherein the first layer has a surface roughness after detachment that is between about 35 and 60 Å RMS.

* * * * *